United States Patent
Ikeda et al.

(10) Patent No.: US 11,264,351 B2
(45) Date of Patent: Mar. 1, 2022

(54) METHOD OF MANUFACTURING CHIP MODULE

(71) Applicant: SHINDENGEN ELECTRIC MANUFACTURING CO., LTD., Tokyo (JP)

(72) Inventors: Kosuke Ikeda, Hanno (JP); Osamu Matsuzaki, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 795 days.

(21) Appl. No.: 15/779,706

(22) PCT Filed: May 19, 2017

(86) PCT No.: PCT/JP2017/018812
§ 371 (c)(1),
(2) Date: May 29, 2018

(87) PCT Pub. No.: WO2018/211681
PCT Pub. Date: Nov. 22, 2018

(65) Prior Publication Data
US 2021/0175197 A1    Jun. 10, 2021

(51) Int. Cl.
*H01L 21/44* (2006.01)
*H01L 23/495* (2006.01)
(Continued)

(52) U.S. Cl.
CPC .............. *H01L 24/37* (2013.01); *H01L 24/40* (2013.01); *H01L 24/73* (2013.01); *H01L 24/77* (2013.01);
(Continued)

(58) Field of Classification Search
CPC ......... H01L 24/29; H01L 24/37; H01L 24/40; H01L 23/49575
(Continued)

(56) References Cited

U.S. PATENT DOCUMENTS 5,218,231 A * 6/1993 Kudo ...................... H01L 24/36
257/735
7,557,434 B2 * 7/2009 Malhan ................... H01L 24/72
257/678
(Continued)

FOREIGN PATENT DOCUMENTS

EP          2506300 A2      2/2012
JP       H07326636 A       12/1995
(Continued)

OTHER PUBLICATIONS

International Search Report for PCT/JP2017/018812, dated Aug. 8, 2017, and its English translation provided by Google Translate.
(Continued)

*Primary Examiner* — Calvin Lee
(74) *Attorney, Agent, or Firm* — Ladas & Parry, LLP

(57) ABSTRACT

A method of manufacturing a chip module comprises a step of disposing a first electronic element 13 on a first jig 500, a step of disposing a first connector 60 on the first electronic element 13 via a conductive adhesive 5, a step of disposing a second electronic element 23 on the first connector 60 via a conductive adhesive 5, a step of disposing a second connector 70 on a second jig 550, a step of reversing the second jig in a state where the second connector 70 is fixed to the second jig 550 and disposing the second connector 70 on the second electronic element 23 via a conductive adhesive 5, and a step of curing the conductive adhesives 5.

7 Claims, 13 Drawing Sheets

(51) Int. Cl.
    *H01L 23/00*       (2006.01)
    *H01L 25/07*       (2006.01)

(52) U.S. Cl.
    CPC ............ *H01L 24/83* (2013.01); *H01L 24/92* (2013.01); *H01L 25/074* (2013.01); *H01L 2224/404* (2013.01); *H01L 2224/4007* (2013.01); *H01L 2224/40227* (2013.01); *H01L 2224/73263* (2013.01)

(58) Field of Classification Search
    USPC .......................... 257/672, 776; 438/611–614
    See application file for complete search history.

(56) References Cited

U.S. PATENT DOCUMENTS

| | | | |
|---|---|---|---|
| 8,492,884 B2* | 7/2013 | Pruitt | H01L 23/495 257/676 |
| 9,704,819 B1* | 7/2017 | Gao | H01L 24/92 |
| 9,893,641 B2* | 2/2018 | Nakajima | H01L 25/074 |
| 2003/0132530 A1 | 7/2003 | Teshima et al. | |
| 2009/0194856 A1 | 8/2009 | Gomez | |
| 2010/0193921 A1 | 8/2010 | Jereza et al. | |
| 2011/0081750 A1 | 4/2011 | Machida | |
| 2011/0312134 A1 | 12/2011 | Machida | |
| 2013/0102112 A1 | 4/2013 | Chen et al. | |
| 2013/0113114 A1 | 5/2013 | Hosseini et al. | |
| 2015/0221581 A1 | 8/2015 | Tamura | |

FOREIGN PATENT DOCUMENTS

| | | |
|---|---|---|
| JP | 2002110893 A | 4/2002 |
| JP | 2008110893 A | 5/2008 |
| JP | 2009130044 A | 6/2009 |
| JP | 2011082323 A | 4/2011 |
| JP | 2011114176 A | 6/2011 |
| JP | 2014045157 A | 3/2014 |
| JP | 2016066700 A | 4/2016 |
| JP | 2017059799 A | 3/2017 |
| WO | 2011156051 A1 | 12/2011 |
| WO | 2012133760 A1 | 10/2012 |

OTHER PUBLICATIONS

International Preliminary Examination Report (Chapter II) for PCT/JP2017/018812, dated Jan. 1, 2018, and its English translation provided by Google Translate.
Written Opinion for PCT/JP2017/018812, dated Aug. 8, 2017, and its English translation provided by Google Translate.
Office Action from TW app. No. 107115455, dated Dec. 22, 2018, with machine English translation from Google Translate.
Search Report from NL app. No. 2020927, dated Jan. 10, 2019, with machine English translation.
International Search Report from PCT/JP2017/018812, dated Aug. 8, 2017, with English translation from WIPO.

\* cited by examiner

METHOD OF MANUFACTURING CHIP MODULE

CROSS-REFERENCE TO RELATED APPLICATION

The present application is the U.S. national phase of PCT Application PCT/JP2017/018812 filed on May 19, 2017, the disclosure of which is incorporated herein by reference in its entirety.

TECHNICAL FIELD

The present invention relates to a method of manufacturing a chip module including a plurality of electronic elements.

BACKGROUND ART

An electronic module in which a plurality of electronic elements is provided in a sealing resin has been conventionally known (for example, refer to JP 2014-45157 A). It is desired to reduce the size of such an electronic module.

As one of methods of reducing the size of the electronic module, it is conceivable to employ an aspect of laminating the electronic elements in layers. In that case, it is conceivable to provide a connector on one side (for example, front side) of the electronic element (first electronic element) and provide another electronic element (second electronic element) on the one side of the connector. It is desired to efficiently manufacture such an electronic module including the first electronic element and the second electronic element.

SUMMARY OF INVENTION

Technical Problem

The present invention provides a method of efficiently manufacturing a chip module including a first electronic element and a second electronic element, and accordingly, provides a method of efficiently manufacturing an electronic module.

Solution to Problem

A method of manufacturing a chip module according to the present invention may comprise:
- a step of disposing a first electronic element on a first jig;
- a step of disposing a first connector on the first electronic element via a conductive adhesive;
- a step of disposing a second electronic element on the first connector via a conductive adhesive;
- a step of disposing a second connector on a second jig;
- a step of reversing the second jig in a state where the second connector is fixed to the second jig and disposing the second connector on the second electronic element via a conductive adhesive; and
- a step of curing the conductive adhesives.

In the method of manufacturing the chip module according to the present invention,
- the first jig may have a first jig recess corresponding to height of the chip module, or
- the second jig may have a second jig recess corresponding to height of the chip module.

The method of manufacturing the chip module according to the present invention may further comprise
- a step of disposing a fourth connector on the first electronic element via a conductive adhesive.

The method of manufacturing the chip module according to the present invention may further comprise
- a step of disposing a third connector in the second jig, wherein the second jig may be reversed in a state where the second connector and the third connector are fixed to the second jig, and the second connector and the third connector may be disposed on the second electronic element via a conductive adhesive.

In the method of manufacturing the chip module according to the present invention,
- the first connector may have a supporting part, and
- the supporting part may contact with the first jig in the step of disposing the first connector on the first, electronic element via the conductive adhesive.

In the method of manufacturing the chip module according to the present invention,
- the second connector may have an extending part, and
- the extending part may contact with the first jig in the step of disposing the second connector on the second electronic element via the conductive adhesive.

In the method of manufacturing the chip module according to the present invention,
- the first connector may have a plurality of supporting parts,
- the second connector may have a plurality of extending parts,
- the supporting parts may contact with the first jig in the step of disposing the first connector on the first electronic element via the conductive adhesive and
- the extending parts may contact with the first jig in the step of disposing the second connector on the second electronic element via the conductive adhesive.

A method of manufacturing a chip module according to the present invention may comprise:
- a step of disposing a first electronic element on a first jig;
- a step of disposing a second connector on a second jig;
- a step of disposing a second electronic element on the second connector via a conductive adhesive;
- a step of disposing a first connector on the second electronic element via a conductive adhesive;
- a step of reversing the first jig in a state where the first electronic element is fixed to the first jig and disposing the first electronic element on the first connector via a conductive adhesive; and
- a step of curing the conductive adhesives.

A method of manufacturing a chip module according to the present invention may comprise:
- a step of placing a conductive plate on one side of a first electronic element via a conductive adhesive and the step in which the conductive plate is supported by a supporting part;
- a step of placing a second electronic element on one side of the first conductive plate;
- a step of curing the conductive adhesive; and
- a step of forming a connector by cutting the conductive plate.

Advantageous Effects of Invention

In the present invention, in a case where an aspect is employed in which a first electronic element is disposed on a first jig and a second connector is disposed on a second jig and the first jig or the second jig is reversed to manufacture a chip module, the chip module including the first electronic element and a second electronic element can be efficiently manufactured. Accordingly, an electronic module can be efficiently manufactured.

In addition, in the present invention, in a case where an aspect is employed in which a conductive plate is cut to form a connector after the conductive plate is supported by a supporting part and a conductive adhesive is cured so that a chip module is manufactured, the chip module including the first electronic element and the second electronic element can be efficiently manufactured. Accordingly, the electronic module can be efficiently manufactured.

DESCRIPTION OF EMBODIMENTS

First Embodiment

Configuration

Figure 1:
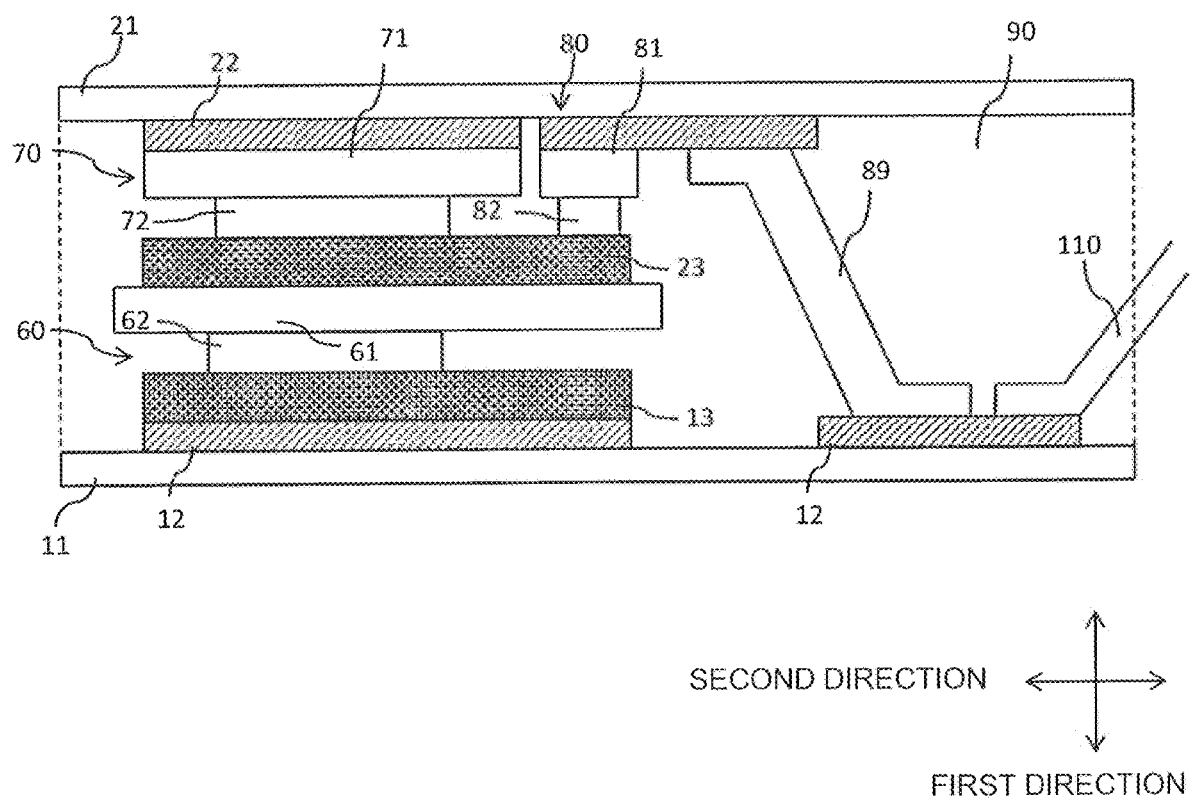
FIG. 1 is a longitudinal sectional view of an electronic module which can be used in a first embodiment of the present invention.

In the present embodiment, "one side" means an upper side in FIG. 1, and "the other side" means a lower side in FIG. 1. The vertical direction in FIG. 1 is referred to as a "first direction", the horizontal direction is referred to as a "second direction", and the front-back direction of a paper sheet surface is referred to as a "third direction", The in-plane direction including the second direction and the third direction is referred to as a "plane direction", and a state viewed from the upper side of FIG. 1 is referred to as a "plane view".

The electronic module according to the present embodiment may have a first electronic unit and a second electronic unit.

Figure 3:
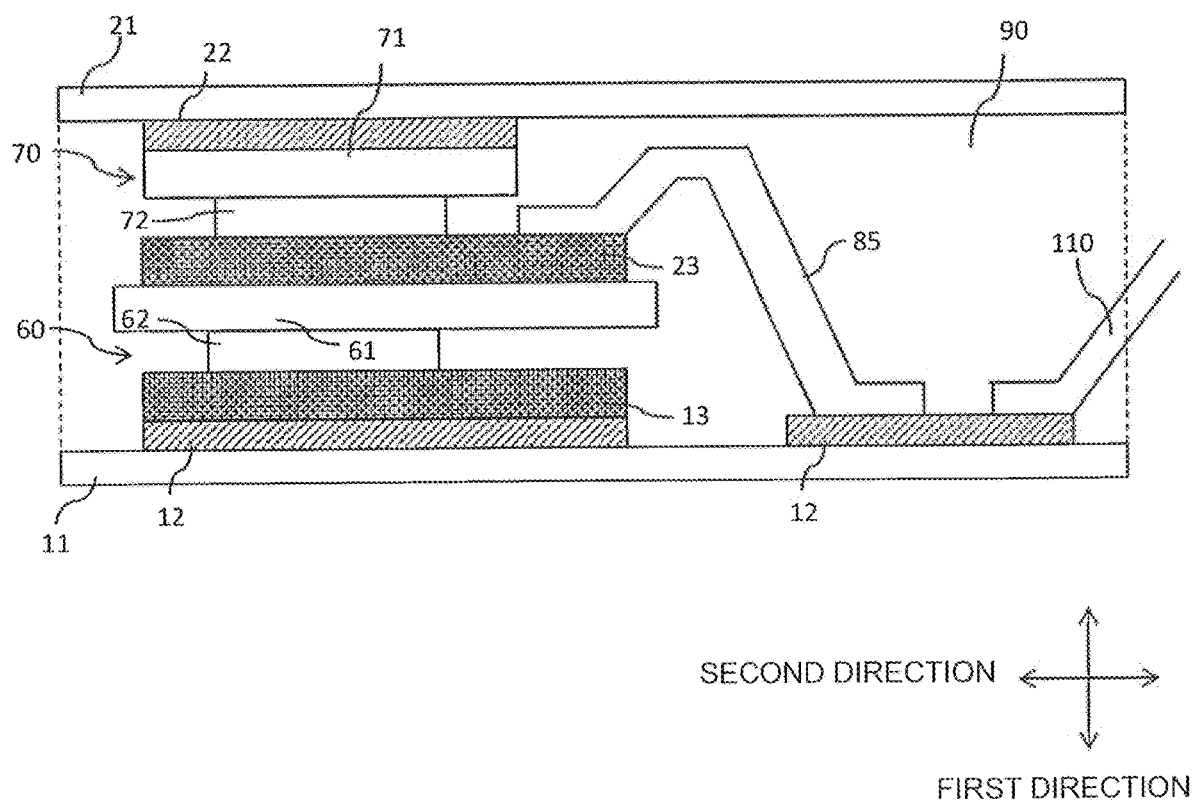
FIG. 3 is a longitudinal sectional view of another example of the electronic module which can be used in the first embodiment of the present invention.

As illustrated in FIG. 1, the first electronic unit may have a first substrate 11, a plurality of first conductive layers 12 provided on one side of the first substrate 11, and a first electronic element 13 provided on the one side of the first conductive layer 12. The first electronic element 13 may be a switching element or a control element. In a case where the first electronic element 13 is the switching element, the first electronic element 13 may be a MOSFET, an IGBT, and the like. Each of the first electronic element 13 and a second electronic element 23 to be described later may be formed of a semiconductor element, and a semiconductor material may be silicon, silicon carbide, gallium nitride, and the like. The surface on the other side of the first electronic element 13 may be connected to the first conductive layer 12 via a conductive adhesive 5 (refer to FIGS. 7 and 8) such as solder. To simplify the display, the conductive adhesive 5 is not illustrated in FIGS. 1, 3, and the like.

A first connector 60 may be provided on the one side of the first electronic element 13. The first connector 60 may be connected to the surface on the one side of the first electronic element 13 via the conductive adhesive 5 such as solder.

As illustrated in FIG. 1, a second electronic unit may be provided on the one side of the first connector 60. The second electronic unit may have the second electronic element 23 provided on the one side of the first connector 60. The second electronic unit may have a second substrate 21 and a second conductive layer 22 provided on the other side of the second substrate 21. A second connector 70 may be provided on the other side of the second conductive layer 22. In a case where the second conductive layer 22 is provided, the second electronic element 23 may be provided in the second conductive layer 22, unlike the aspect illustrated in FIG. 1. The second connector 70 may be connected to the surface on the one side of the second electronic element 23 and the surface on the other side of the second conductive layer 22 via the conductive adhesive 5 such as solder.

The second electronic element 23 may be a switching element or a control element. In a case where the second electronic element 23 is the switching element, the second electronic element 23 may be a MOSFET, an IGBT, and the like.

The first connector 60 may have a first head part 61 and a first pillar part 62 extending from the first head part 61 toward the other side. The second connector 70 may have a second head part 71 and a second pillar part 72 extending from the second head part 71 toward the other side. A cross section of the first connector 60 may have a substantially T-like shape, and a cross section of the second connector 70 may have a substantially T-like shape.

The electronic module may have a sealing part 90 which is formed of a sealing resin and the like for sealing the first electronic element 13, the second electronic element 23, the first connector 60, the second connector 70, the first conductive layer 12, the second conductive layer 22, and the like (refer to FIG. 1). The first conductive layer 12 may be connected to a terminal part 110 which is projected outward from the sealing part 90 and can be connected to an external device.

Figure 2:
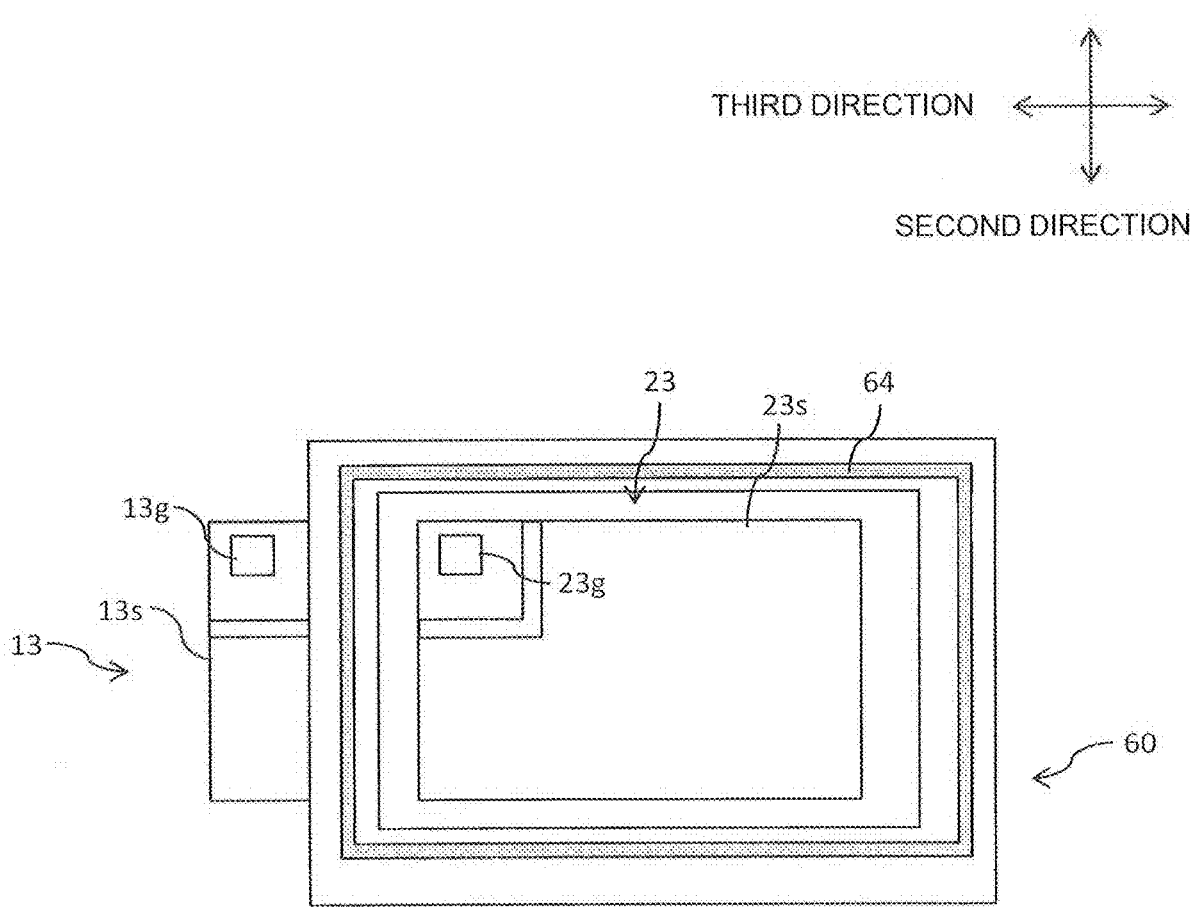
FIG. 2 is a plan view of the electronic module which can be used in the first embodiment of the present invention.

As illustrated in FIG. 2, a first groove 64 may be provided on a surface on the one side of the first head part 61. Although the first groove 64 is provided on the outer side of a circumference of the first pillar part 62 in a plane view (plane direction), the first groove 64 may be provided in a part or all of the outer side of the circumference of the first pillar part 62. On the surface on the one side of the first head part 61 and on the inner side of the circumference of the first groove, the conductive adhesive 5 such as solder may be provided, and the second electronic element 23 may be provided via the conductive adhesive 5.

As illustrated in FIG. 1, a third connector 80 may be provided on the one side of the second electronic element 23. The third connector 80 may have a third head part 81 and a third pillar part 82 extending from the third head part 81 toward the other side. The third connector 80 may be connected to the surface on the other side of the second conductive layer 22 and the surface on the one side of the second electronic element 23 via the conductive adhesive 5 such as solder. In addition, the second conductive layer 22 to which the third connector 80 is connected may be connected to the first conductive layer 12 via a connector 89. As the third connector 80, not a connector with a longitudinal cross section having the third pillar part 82 which has a substantially T-like shape, a connector 85 (refer to FIG. 3) may be used.

As illustrated in FIG. 2, in a plane view, the first electronic element 13 may be exposed outward from the first head part 61. In a case where the first electronic element 13 is a switching element such as a MOSFET, a first gate terminal 13g and the like may be provided in the exposed part from the outside. Similarly, in a case where the second electronic element 23 is a switching element such as a MOSFET, a second gate terminal 23g and the like may be provided on the surface on the one side. The first electronic element 13 illustrated in FIG. 2 has the first gate terminal 13g and a first source terminal 13s on the surface on the one side, and the second electronic element 23 has the second gate terminal 23g and a second source terminal 23s on the surface on the one side. In this case, the second connector 70 may be connected to the second source terminal 23s of the second electronic element 23 via the conductive adhesive 5, and the third connector 80 (including connector 85) may be connected to the second gate terminal 23g of the second electronic element 23 via the conductive adhesive 5. The first connector 60 may connect the first source terminal 13s of the first electronic element 13 and a second drain terminal provided on the other side of the second electronic element 23 via the conductive adhesive 5. The first drain terminal provided on the other side of the first electronic element 13 may be connected to the first conductive layer 12 via the conductive adhesive 5. The first gate terminal 13g of the first electronic element 13 may be connected to a fourth connector 95 (refer to FIG. 4) formed of a connector and the like via the conductive adhesive 5, and the connector 85 may be connected to the first conductive layer 12 via the conductive adhesive 5.

In a case where only one of the first electronic element 13 and the second electronic element 23 is a switching element, it is also conceivable that a control element with low heat generation property is used as the second electronic element 23 placed on the first connector 60 and the switching element is used as the first electronic element 13. Conversely, it is also conceivable that the switching element is used as the second electronic element 23 placed on the first connector 60 and the control element with low heat generation property is used as the first electronic element 13.

Furthermore, a chip module may have the first electronic element 13, the second electronic element 23, the first connector 60, the second connector 70, the third connector 80, and the fourth connector 95. In this case, the chip module having the first electronic element 13, the second electronic element 23, the first connector 60, the second connector 70, the third connector 80, and the fourth connector 95 is sealed with by the sealing part 90 after being disposed between the first substrate 11 having the first conductive layer 12 and the second substrate 21 having the second conductive layer 22 to manufacture an electronic module.

As the first substrate 11 and the second substrate 21, a ceramic substrate, an insulating resin layer, and the like can be employed. As the conductive adhesive 5, in addition to the solder, a material containing Ag or Cu as a main component can be used. As the material of the first connector 60 and the second connector 70, a metal such as Cu can be used. As the substrates 11 and 21, for example, a metal substrate to which circuit patterning has been performed can be used. In this case, the substrates 11 and 21 respectively serve as the conductive layers 12 and 22.

Note that the terminal part 110 and the conductive layers 12 and 22 are bonded by using not only the conductive adhesive 5 such as solder but also laser welding or ultrasonic joining.

Manufacturing Method

Next, an exemplary method of manufacturing the electronic module according to the present embodiment will be described. As the first connector 60 and the second connector 70 used here, those manufactured by the above-described manufacturing process can be used.

First, the first electronic element 13 is disposed on a first jig 500 (first electronic element disposing process, refer to FIG. 4(a)).

Figure 4:
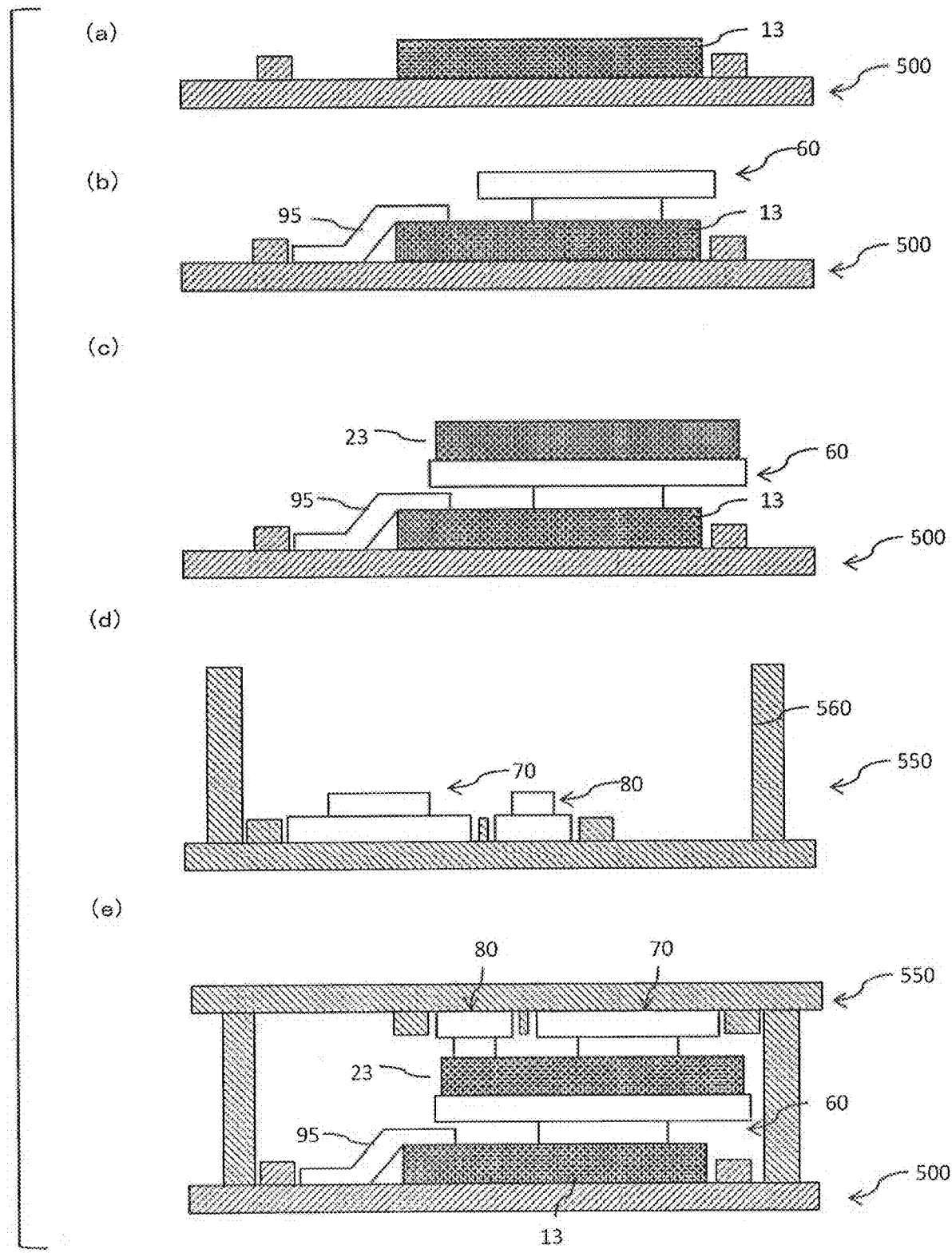
FIGS. 4(a) to 4(e) are longitudinal sectional views of a manufacturing process of a chip module which can be used in the first embodiment of the present invention.

Next, the first connector 60 is disposed on the first electronic element 13 via the conductive adhesive 5 such as solder (first connector disposing process, refer to FIG. 4(b)). Furthermore, the fourth connector 95 is disposed on the first electronic element 13 via the conductive adhesive 5 such as solder (fourth connector disposing process, refer to FIG. 4(b)). In FIG. 4, the conductive adhesive 5 such as solder is not illustrated.

Next, the second electronic element 23 is disposed on the first connector 60 via the conductive adhesive 5 (second electronic element disposing process, refer to FIG. 4(c)). The conductive adhesive 5 on the first connector 60 is disposed on the inner side of the circumference of the first groove of the first electronic element 13.

Next, the conductive adhesive 5 such as solder is placed on the second electronic element 23.

The second connector 70 is disposed on a second jig 550 (second connector disposing process, refer to FIG. 4(d)). Furthermore, the third connector 80 is disposed on the second jig 550 (third connector disposing process, refer to FIG. 4(d)). The second jig 550 may have a plurality of second jig recesses 560 at positions where the respective second connectors 70 are disposed (refer to FIG. 5(b)).

The height of the second jig recess 560 may correspond to the height of the chip module. The correspondence of the height of the second jig recess 560 with the height of the chip module means that the second jig recess 560 has the height equal to or thicker than the design thickness of the entire chip module with consideration of the thickness of the conductive adhesive 5. Note that an aspect may be used in which the second jig 550 does not have the second jig recesses 560 and the first jig 500 has first jig recesses 510 (refer to FIG. 6(a)).

The second jig 550 is reversed in a state where the second connector 70 and the third connector 80 are stuck to and fixed to the second jig 550 by using a suction member and the like so that the second connector 70 and the third connector 80 are disposed on the second electronic element 23 via the conductive adhesive 5 (reversing and placing process, refer to FIG. 4(e)). In the present embodiment, sticking is used as a method of fixing the second connector 70 to the second jig 550. However, the absorption is merely an example, and various aspects such as supporting with a support can be employed. However, in a case where the second connector 70 is stuck to the second jig 550 with the suction member and the like, the second connector 70 can be reversed without mechanical friction. Therefore, this method is advantageous in that disadvantages such as generation of dust can be prevented.

Figure 5:
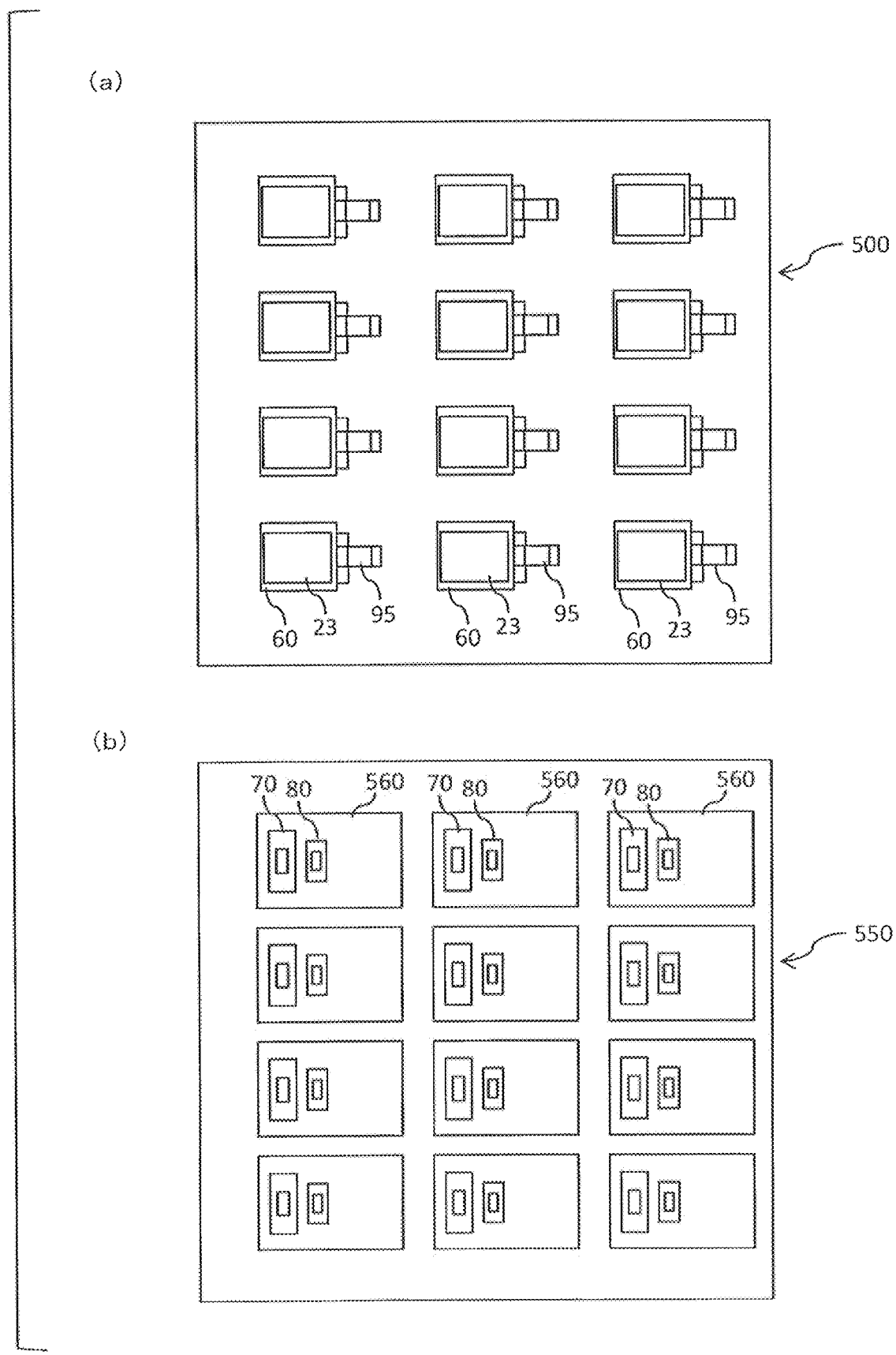
FIG. 5(a) is a plan view of a first jig which can be used in the first embodiment of the present invention.
FIG. 5(b) is a plan view of a second jig which can be used in the first embodiment of the present invention.

In a case where the aspect illustrated in FIG. 5 is employed, in the reversing and placing process, the second jig 550 is reversed in a state where the plurality of second connectors 70 and the plurality of third connectors 80 are stuck to the second jig 550 as illustrated in FIG. 5(b), and each of the second connectors 70 and each of the third connectors 80 are placed on the corresponding second electronic element 23 (refer to FIG. 5(a)).

Next, the conductive adhesive 5 is heated and melted, and after that, the conductive adhesive 5 is cured (reflowed) (first curing process). In this way, the chip module having the first electronic element 13 and the second electronic element 23 is manufactured.

When the chip module is manufactured in this way, the first electronic element 13 of the chip module is placed on the first conductive layer 12 provided on the first substrate 11 via the conductive adhesive 5.

Next, the second conductive layer 22 provided on the second substrate 21 is placed on the second connector 70 and the third connector 80 of the chip module via the conductive adhesive 5. Note that a plurality of chip modules may be provided.

When the chip module is sandwiched between the first substrate 11 and the second substrate 21 in this way, the terminal part 110 is provided on the first conductive layer 12, where the chip module is not provided, via the conductive adhesive 5 (refer to FIG. 1). Note that the terminal part 110 is provided on a lead frame, and after a sealing process to be described below, a connecting body of the lead frame connecting the terminal parts 110 may be cut.

Next, the conductive adhesive 5 is heated and melted, and after that, the conductive adhesive 5 is cured (reflowed) (second curing process). Note that the conductive adhesive 5 used at this time and the conductive adhesive 5 used at the time of manufacturing the chip module may made of the same material. Unlike such an aspect, a melting point of the conductive adhesive 5 at this time is lower than that of the conductive adhesive 5 when the chip module is manufactured. In the second curing process, the conductive adhesive 5 may be heated at a temperature lower than the melting point of the conductive adhesive 5 used when the chip module is manufactured.

Next, the sealing resin is injected between the first substrate 11 and the second substrate 21 or so as to cover the first substrate 11 and the second substrate 21 (sealing process.

As described above, the electronic module according to the present embodiment is manufactured.

Action/Effect

Next, an example of an action and an effect according to the present embodiment having the above configuration will be described. Note that any of the aspects described in the "action/effect" can be employed in the above configuration.

The step of disposing the first electronic element 13 on the first jig 500, disposing the first connector 60 on the first electronic element 13, and disposing the second electronic element 23 on the first connector 60 and the step of disposing the second connector 70 on the second jig 550 are individually performed. The second jig 550 is reversed in a state where the second connector 70 is fixed to the second jig 550, and the second connector 70 is disposed on the second electronic element 23. After that the conductive adhesive 5 is cured. When this process is employed, these processes are advantageous in that the chip module having the first electronic element 13, the first connector 60, the second electronic element 23, and the second connector 70 can be effectively manufactured.

Note that the step of curing the conductive adhesive 5 may be performed after the first connector 60 is disposed on the first electronic element 13 via the conductive adhesive 5 and the second electronic element 23 is disposed on the first connector 60 via the conductive adhesive 5. In this case, a spare chip module including the first electronic element 13, the first connector 60, and the second electronic element 23 can be manufactured, and this case is advantageous in that these elements can be used as a single chip module.

Furthermore, in a case where an aspect is employed in which the height of the second jig recess 560 or the first jig recess 510 corresponds to the height of the chip module, when the second connector 70 is placed on the second electronic element 23, this aspect is advantageous in a point reduction in the thickness of the conductive adhesive 5 caused by being pressed by the second jig 550 can be prevented.

When an aspect is employed in which the second jig recess 560 or the first jig recess 510 is provided, the aspect is advantageous in that occurrence of a positional shift in the plane direction can be prevented.

Second Embodiment

Next, a second embodiment of the present invention will be described.

Figure 6:
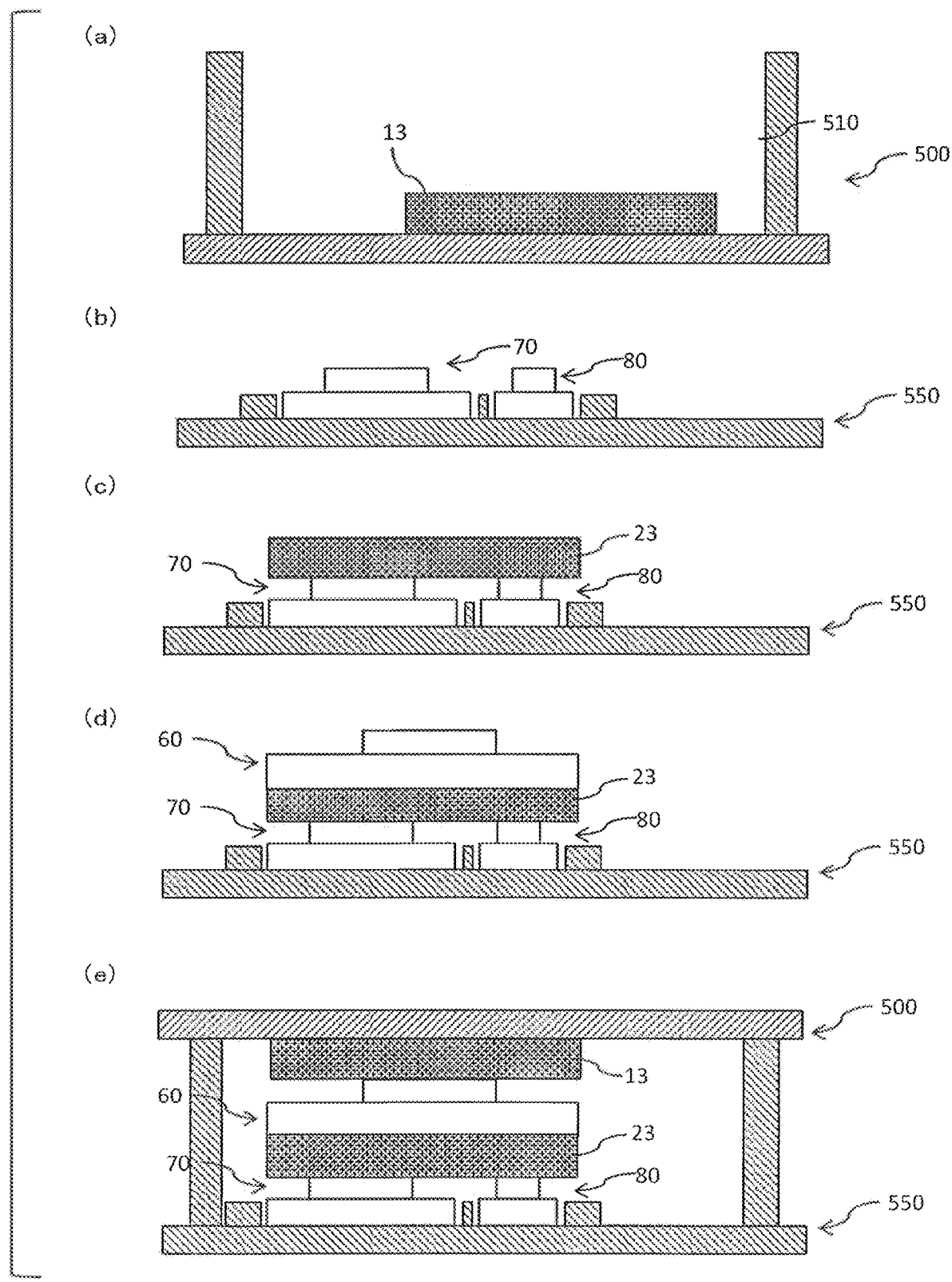
FIGS. 6(a) to 6(e) are longitudinal sectional views of a manufacturing process of a chip module which can be used in a second embodiment of the present invention.

The first embodiment is an aspect in which the second jig 550 which is stuck to the second connector 70 is reversed. In the present embodiment, as illustrated in FIG. 6, the first jig 500 which is stuck to the first electronic element 13 is reversed. Other components are the same as those in the first embodiment, and any aspects described in the first embodiment can be employed. In the following description, the members described in the first embodiment are respectively denoted with the same reference numerals.

First, a first electronic element 13 is disposed on a first jig 500 (first electronic element disposing process, refer to FIG. 6(a)). The first jig 500 may have a plurality of first jig recesses 510 at position where the first electronic element 13 is disposed. The height of the first jig recess 510 may correspond to the height of a chip module.

Next, a second connector 70 is disposed on a second jig 550 (second connector disposing process, refer to FIG. 6(b)). Furthermore, a third connector 80 is disposed on the second jig 550 (third connector disposing process, refer to FIG. 6(b)).

Next, a second electronic element 23 is disposed on the second connector 70 and the third connector 80 via a conductive adhesive 5 (second electronic element disposing process, refer to FIG. 6(c)).

Next, a first connector 60 is disposed on the second electronic element 23 via the conductive adhesive 5 (first connector disposing process, refer to FIG. 6(d)).

Next, the first jig 500 is reversed in a state where the first electronic element 13 is stuck and fixed to the first jig 500, and the first electronic element 13 is disposed on the second connector 70 via the conductive adhesive 5 (reversing and placing process, refer to FIG. 6(*e*)).

Next, the conductive adhesive 5 is heated and melted, and after that, the conductive adhesive 5 is cured (reflowed) (first curing process). In this way, the chip module having the first electronic element 13 and the second electronic element 23 is manufactured.

A fourth connector 95 may be connected with the conductive adhesive 5 after the chip module has been manufactured. In the present embodiment, it is advantageous in that the chip module having the first electronic element 13, the first connector 60, the second electronic element 23, and the second connector 70 can be effectively manufactured. However, in the present, embodiment, it is necessary to post-fit the fourth connector 95 to the chip module, and in this point, the first embodiment is more advantageous.

Third Embodiment

Next, a third embodiment of the present invention will be described.

Figure 7:
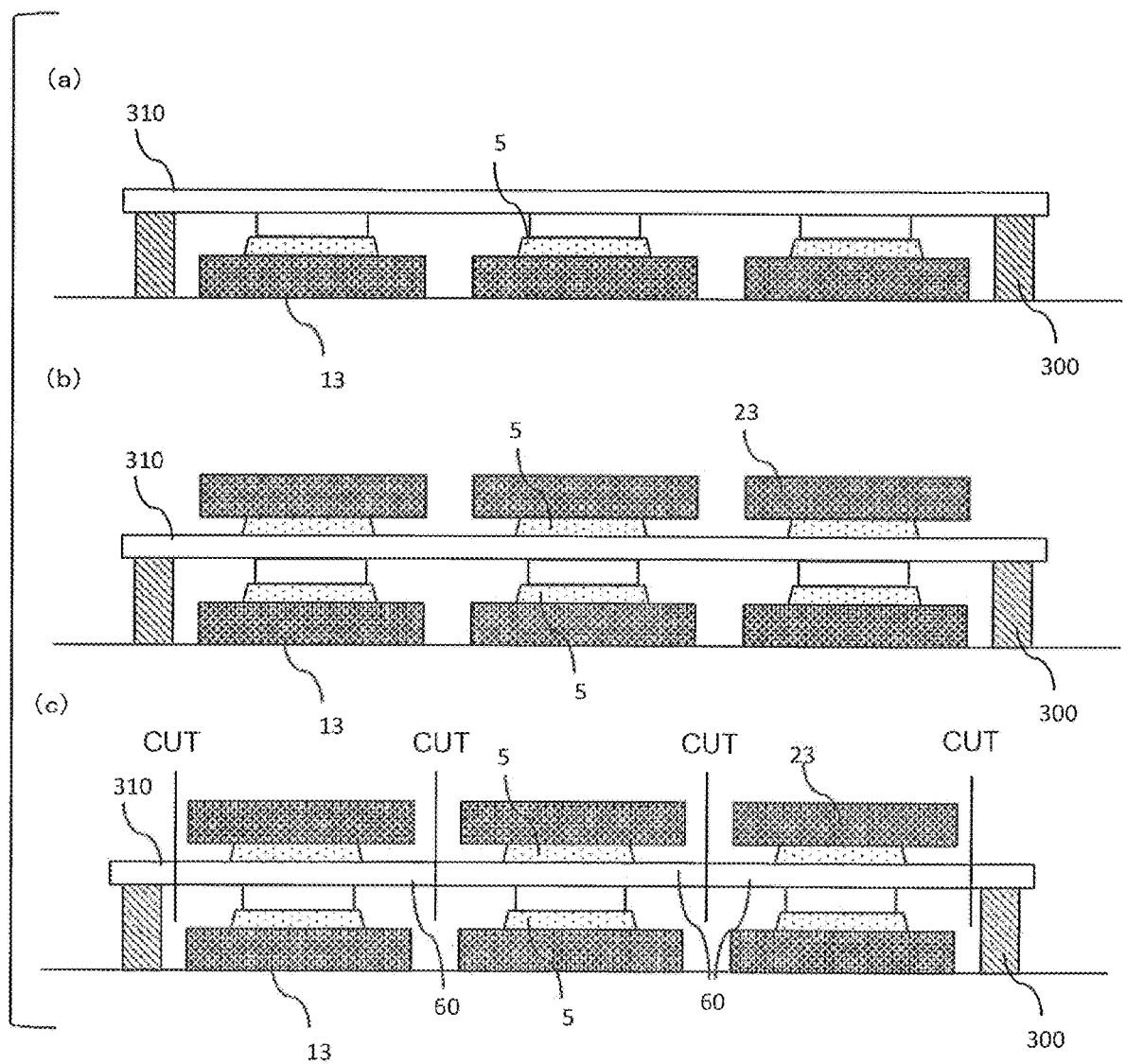
FIGS. 7(a) to 7(c) are longitudinal sectional views of a manufacturing process of a chip module which can be used in a third embodiment of the present invention.

In the present embodiment, a chip module is manufactured by using first plate supporting parts 300 which support a first conductive plate 310 (refer to FIG. 7). The first conductive plate 310 is cut to be a first connector 60. In the present embodiment, a second connector 70 is not provided. Regarding other components, any aspects described in the above embodiments can be employed. In the following description, the members described in the above embodiments are respectively denoted with the same reference numerals. Note that the first plate supporting part 300 is a kind of supporting parts and is included in the supporting part. In addition, the first conductive plate 310 is a kind of conductive plates and is included in the conductive plate.

In the present embodiment, the first conductive plate 310 is placed on one sides of first electronic elements 13 via conductive adhesives 5 (first conductive plate placing process, refer to FIG. 7(*a*)). At this time, at least both ends of the first conductive plate 310 may be supported by the first plate supporting parts 300. Two or more first plate supporting parts 300 may be provided, for example, four first plate supporting parts 300 may be provided to support four corners of the first conductive plate 310, or six first plate supporting parts 300 may be provided to support the first conductive plate 310 at six positions.

Next, second electronic elements 23 are placed on one side of the first conductive plate 310 via the conductive adhesives 5 (second electronic element placing process, refer to FIG. 7(*b*)).

Next, the conductive adhesives 5 are heated and melted, and after that, the conductive adhesive 5 is cured (reflowed) (curing process).

Next, the first conductive plate 310 is cut to form first connectors 60 (cutting process, refer to FIG. 7(*c*)). In this way, the chip module according to the present embodiment is manufactured.

According to the present embodiment, the conductive adhesive 5 is cured while the height is maintained by the first plate supporting part 300 so that the reduction in the thickness of the conductive adhesive 5 caused by the weight of the first conductive plate 310 can be prevented. In addition, it can be expected that the conductive adhesive 5 having the same thickness as that of a plurality of chip modules is provided, and occurrence of variations in chip modules can be prevented.

Fourth Embodiment

Next, a fourth embodiment of the present invention will be described.

In the fourth embodiment, the second connector 70 is not provided. However, in the present embodiment, the second connector 70 is provided. Other components are the same as those in the third embodiment. Any aspects described in the above embodiments can be employed. In the following description, the members described in the above embodiments are respectively denoted with the same reference numerals. Note that a second plate supporting part 350 is a kind of supporting parts and is included in the supporting part. In addition, a second conductive plate 360 is a kind of conductive plates and is included in the conductive plate.

Figure 8:
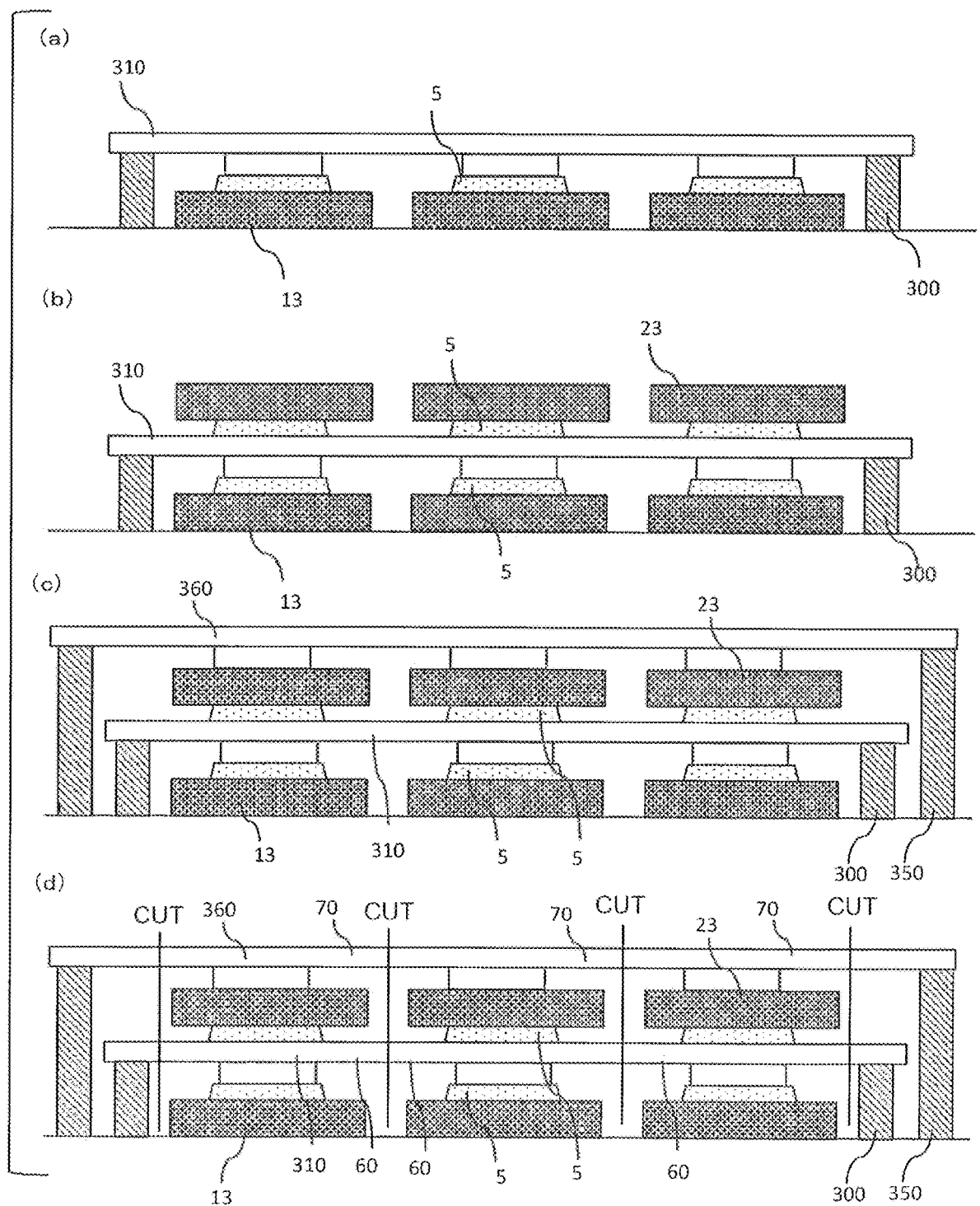
FIGS. 8(a) to 8(d) are longitudinal sectional views of a manufacturing process of a chip module which can be used in a fourth embodiment of the present invention.

A first conductive plate 310 is placed on one sides of first electronic elements 13 via conductive adhesives 5 (first conductive plate placing process, refer to FIG. 8(*a*)). At this time, at least both ends of the first conductive plate 310 may be supported by the first plate supporting parts 300.

Next, second electronic elements 23 are placed on one side of the first conductive plate 310 via the conductive adhesives 5 (second electronic element placing process, refer to FIG. 8(*b*)).

Next, the second conductive plate 360 is placed on one sides of the second electronic elements 23 via the conductive adhesives 5 (second conductive plate placing process, refer to FIG. 8(*c*)). At this time, at least both ends of the second conductive plate 360 may be supported by the second plate supporting parts 350. Similarly to the first plate supporting part 300 described in the third embodiment, two or more second plate supporting parts 350 may be provided. For example, four second plate supporting parts 350 may be provided to support four corners of the second conductive plate 360, or six second plate supporting parts 350 may be provided to support the second conductive plate 360 at six positions.

Next, the conductive adhesives 5 are heated and melted, and after that, the conductive adhesive 5 is cured (reflowed) (curing process).

Next, the first conductive plate 310 is cut to form first connectors 60, and the second conductive plate 360 is cut to form second connectors 70 (cutting process, refer to FIG. 8(*d*)). In this way, a chip module according to the present embodiment is manufactured. Note that the first conductive plate 310 and the second conductive plate 360 may be concurrently cut, or separately cut. Furthermore, a cutting position of the first conductive plate 310 in the plane direction may be the same as or different from that of the second conductive plate 360.

Furthermore, instead of such an order, according to the process described in the third embodiment, the chip module including the first electronic element 13, the first connector 60, and the second electronic element 23 is manufactured, and the second conductive plate 360 is placed on the one side of the chip module via the conductive adhesive 5. Then, the second conductive plate 360 is cut to form the second connectors 70. The second connector 70 may be formed in this way.

In the present embodiment, since the conductive adhesive 5 is cured while the height is maintained by the first plate supporting part 300 and the second plate supporting part 350 so that reduction in the thickness of the conductive adhesive 5 caused by the weights of the first conductive plate 310 and the second conductive plate 360 can be prevented. In addition, it can be expected that the conductive adhesive 5 having the same thickness as that of the plurality of chip modules is provided, and occurrence of variations in chip modules can be prevented. Furthermore, according to the present embodiment, the second connector 70 can be provided, and an effect caused by providing the second connector 70 can be obtained. The present embodiment is advantageous in this point.

Fifth Embodiment

Next, a fifth embodiment of the present invention will be described.

Figure 9:
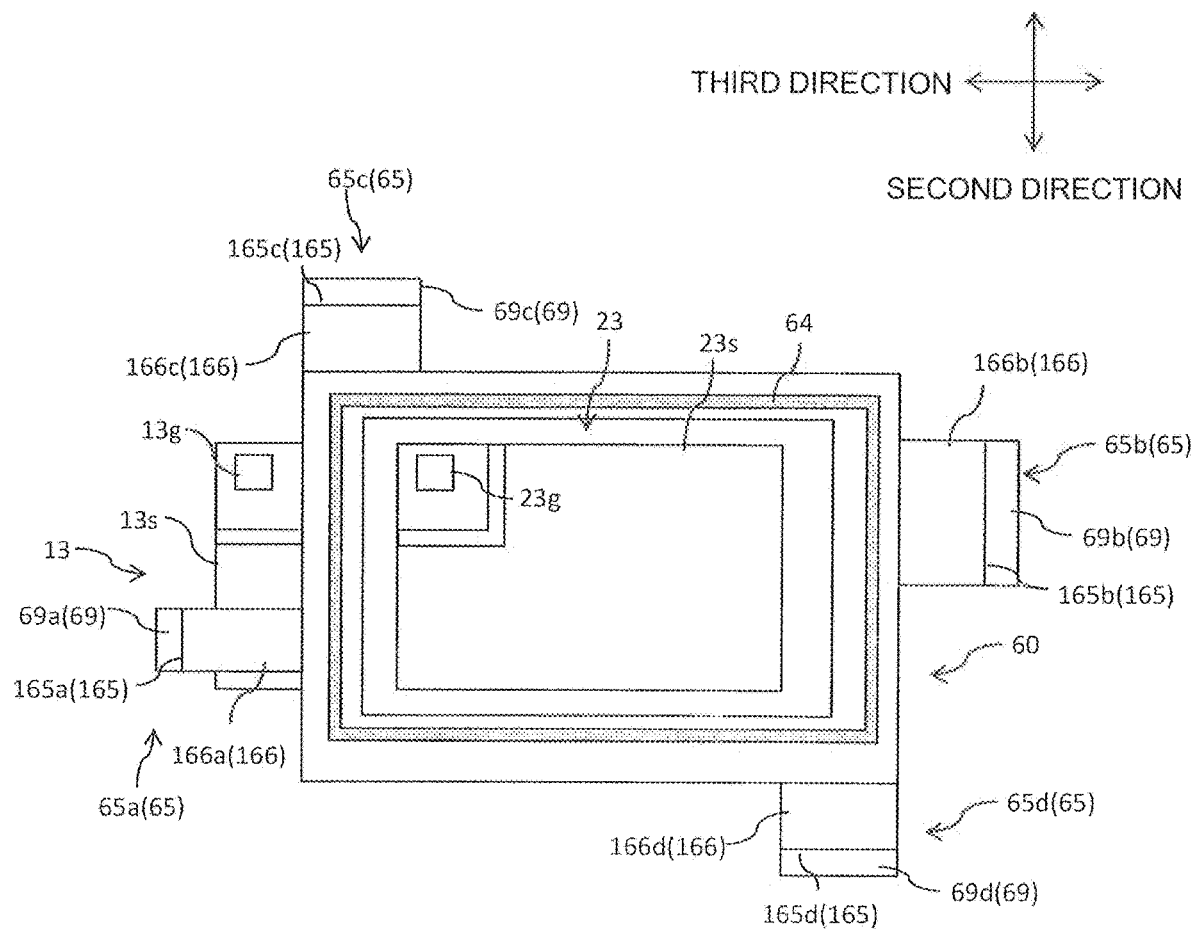
FIG. 9 is a plan view of an electronic module which can be used in a fifth embodiment of the present invention.

In the above embodiments, the first connector 60 with a cross section having a substantially T-like shape has been used. However, the first connector 60 according to the present embodiment has four supporting parts 65 (65a to 65d) extending from a first head part 61 toward the other side as illustrated in FIG. 9. The support 65 has contact with a first conductive layer 12 or a first substrate 11. Regarding other components, any aspects described in the above embodiments can be employed. In the following description, the members described in the above embodiments are respectively denoted with the same reference numerals. The "contact" in the present application includes not only an aspect of direct contact but also an aspect of indirect contact. As the aspect of the indirect contact, for example, an aspect of having contact via a conductive adhesive 5 such as solder can be exemplified.

In the present embodiment, description will be made using an aspect of using four supporting parts 65. However, the number of supporting parts 65 is not limited to this, and one, two, three, or equal to or more than five supporting parts 65 may be used.

In a case where the supporting part 65 extending from the first head part 61 is provided as in the present embodiment, inclination of a first connector 60 caused by a weight of a second electronic element 23 that occurs when the second electronic element 23 is mounted or after the second electronic element 23 has been mounted can be prevented.

Furthermore, in a case where the plurality of supporting parts 65 is provided as in the present embodiment, the first connector 60 can be more stably provided, and the thickness of the conductive adhesive 5 disposed between the first electronic element 13 and the first connector 60 can be uniformed. Accordingly, reliability can be improved. In addition, when a chip module is manufactured, the first connector 60 can be more stably disposed, and manufacturing efficiency can be enhanced. The present embodiment is advantageous in this point.

From the viewpoint of using the supporting parts 60 in a manufacturing process, the manufacturing process described in the first embodiment is more advantageous than the manufacturing process described in the second embodiment.

In addition, the supporting parts 65 have contact with the first substrate 11 or the first conductive layer 12 so that heat dissipation can be enhanced. In particular, a case where the supporting parts 65 have contact with the first conductive layer 12 is advantageous in that a heat dissipation effect can be further enhanced.

Furthermore, a case where the plurality of supporting parts 65 is provided as in the present embodiment is advantageous in that the first connector 60 can be more stably provided and a higher heat dissipation effect can be realized.

Each supporting part 65 may have support base end parts 69 (69a to 69d) extending in the plane direction and having contact with the first substrate 11 or the first conductive layer 12. In addition, it is not necessary to provide the support base end part 69 for each of the plurality of support parts 65. It is preferable that the support base end parts 69 be provided for a part of the plurality of supporting parts 65 and the support base end parts 69 be not provided for the rest of the supporting parts 65.

In a case where the support base end parts 69 are provided, the first connector 60 can be disposed on the first substrate 11 or the first conductive layer 12 with good balance. In addition, the support base end part 69 can increase a contact area with the first substrate 11 or the first conductive layer 12. Therefore, the heat dissipation effect can be enhanced.

Each of the supporting parts 65 may have contact with the first conductive layer 12. In a case where an aspect is employed in which the first conductive layer 12 connected to the supporting part 65 is not electrically connected to the other first conductive layer 12, the second conductive layer 22, the first electronic element 13, and the second electronic element 23 and does not serve an electrical function, unpredicted behaviors of the first electronic element 13 and the second electronic element 23 caused by turning on the supporting parts 65 can be prevented. The present embodiment is advantageous in this point.

Each supporting part 65 may have plane direction supporting parts 166 (166a to 166d) extending from a first head part 61 along a plane direction and height direction plate supporting parts 165 (165a to 165d) extending from an end of the plane direction supporting part 166 along a height direction (first direction) (refer to seventh embodiment to be described below). Note that the plane direction supporting part 166 means a part in which the length along the width direction is shorter than that of the first head part 61.

It is preferable that the supporting part 65 do not have the plane direction supporting parts 166 and have only the height direction plate supporting parts 165 extending from the first head part 61 along the height direction (first direction).

Sixth Embodiment

Next, a sixth embodiment of the present invention will be described.

Figure 10:
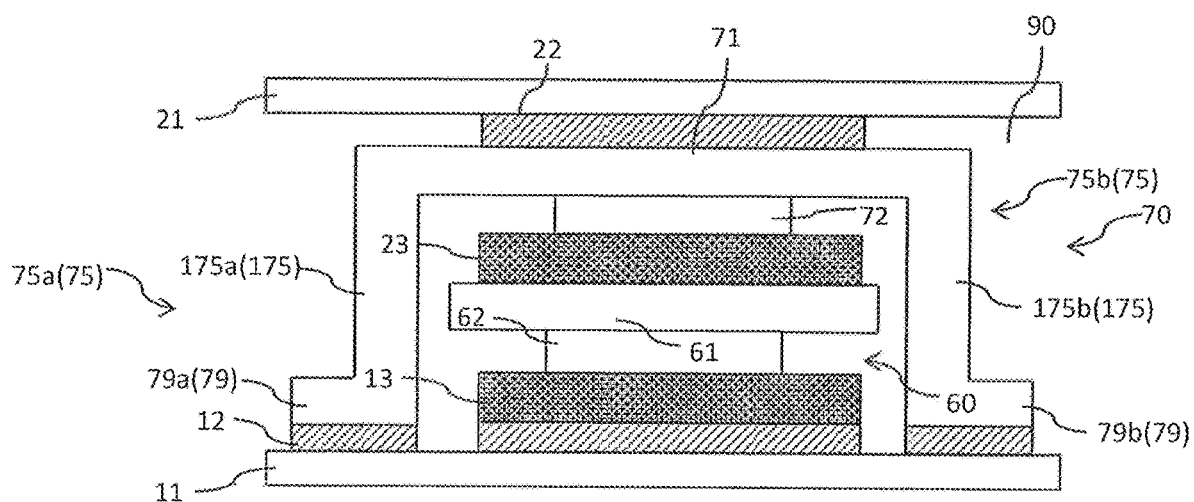
FIG. 10 is a longitudinal sectional view of an electronic module which can be used in a sixth embodiment of the present invention.
Figure 10:
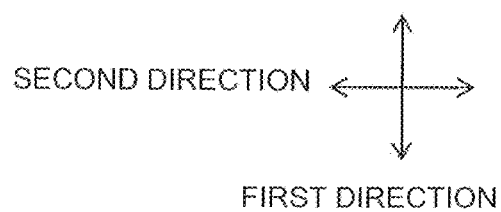

In the above embodiments, the description has been made by using the second connector 70 with a cross section having the second pillar part 72 having a substantially T-like shape. However, in the present embodiment, as illustrated in FIG. 10, the second connector 70 has extending parts 75 (75a and 75b) extending from a second head part 71 toward the other side. Regarding other components, any aspects described in the above embodiments can be employed. In the following description, the members described in the above embodiments are respectively denoted with the same reference numerals. The extending part 75 in the present embodiment has height direction extending parts 175 (175a and 175b) extending from the second head part 71 along the height direction (first direction).

In the present embodiment, description will be made using an aspect in which the two extending parts 75 are used. However, the number of extending parts 75 is not limited to this, and a single or equal to or more than three extending parts 75 may be used.

According to the present embodiment, by providing the extending parts 75, heat from a second electronic element 23 can be efficiently dissipated, and a high heat dissipation effect can be realized by a second connector 70. Furthermore, a case where the plurality of extending parts 75 is provided as in the present embodiment is advantageous in that a higher heat dissipation effect can be realized.

Each of the extending parts 75 may have contact with a first conductive layer 12. It is not necessary to electrically connect the first conductive layer 12 connected to the extending part 75 to the other first conductive layer 12 and a first electronic element 13.

Each extending part 75 may have extending base end parts 79 (79*a* and 79*b*) extending in the plane direction and having contact with the first substrate 11 or the first conductive layer 12. In addition, it is not necessary to provide the extending base end parts 79 for each of the plurality of extending parts 75. It is preferable that the extending base end part 79 be provided for a part of the plurality of extending parts 75 and be not provided for the rest of the extending parts 75.

In a case where the extending base end parts 79 are provided, the second connector 70 can be disposed on the first substrate 11 or the first conductive layer 12 with good balance. In addition, the extending base end part 79 can increase a contact area with the first substrate 11 or the first conductive layer 12. Therefore, the heat dissipation effect can be enhanced.

Furthermore, in a case where the second connector 70 having the plurality of extending parts 75 as in the present embodiment is employed, the second connector 70 can be more stably provided, and the thickness of the conductive adhesive 5 disposed between the second electronic element 23 and the second connector 70 can be uniformed. Accordingly, reliability can be improved. In addition, when a chip module is manufactured, the second connector 70 can be more stably disposed, and manufacturing efficiency can be enhanced. The present embodiment is advantageous in this point.

From the viewpoint of using the extending parts 75 in a manufacturing process, the manufacturing process described in the first embodiment is more advantageous than the manufacturing process described in the second embodiment.

In a case where the second connector 70 having the plurality of extending parts 75 as in the present embodiment is employed, it is possible to apply a repelling force for pushing back a second substrate 21 toward the one side. That is, by applying the heat as described above, force of the first substrate 11 and the second substrate 21 to be warped or distorted is added. However, the present embodiment is advantageous in that the second connector 70 having the plurality of extending parts 75 can prevent the warp and the distortion of the first substrate 11 and the second substrate 21.

Seventh Embodiment

Next, a seventh embodiment of the present invention will be described.

Figure 11:
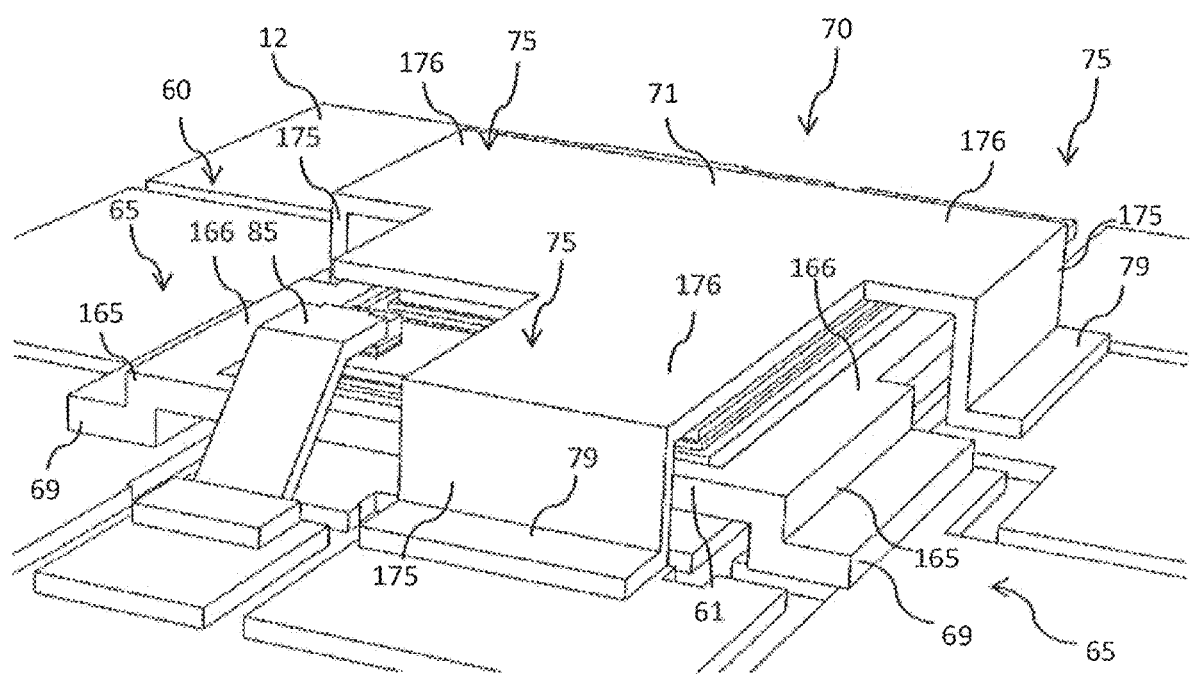
FIG. 11 is a perspective view of an electronic module which can be used in a seventh embodiment of the present invention.
Figure 12:
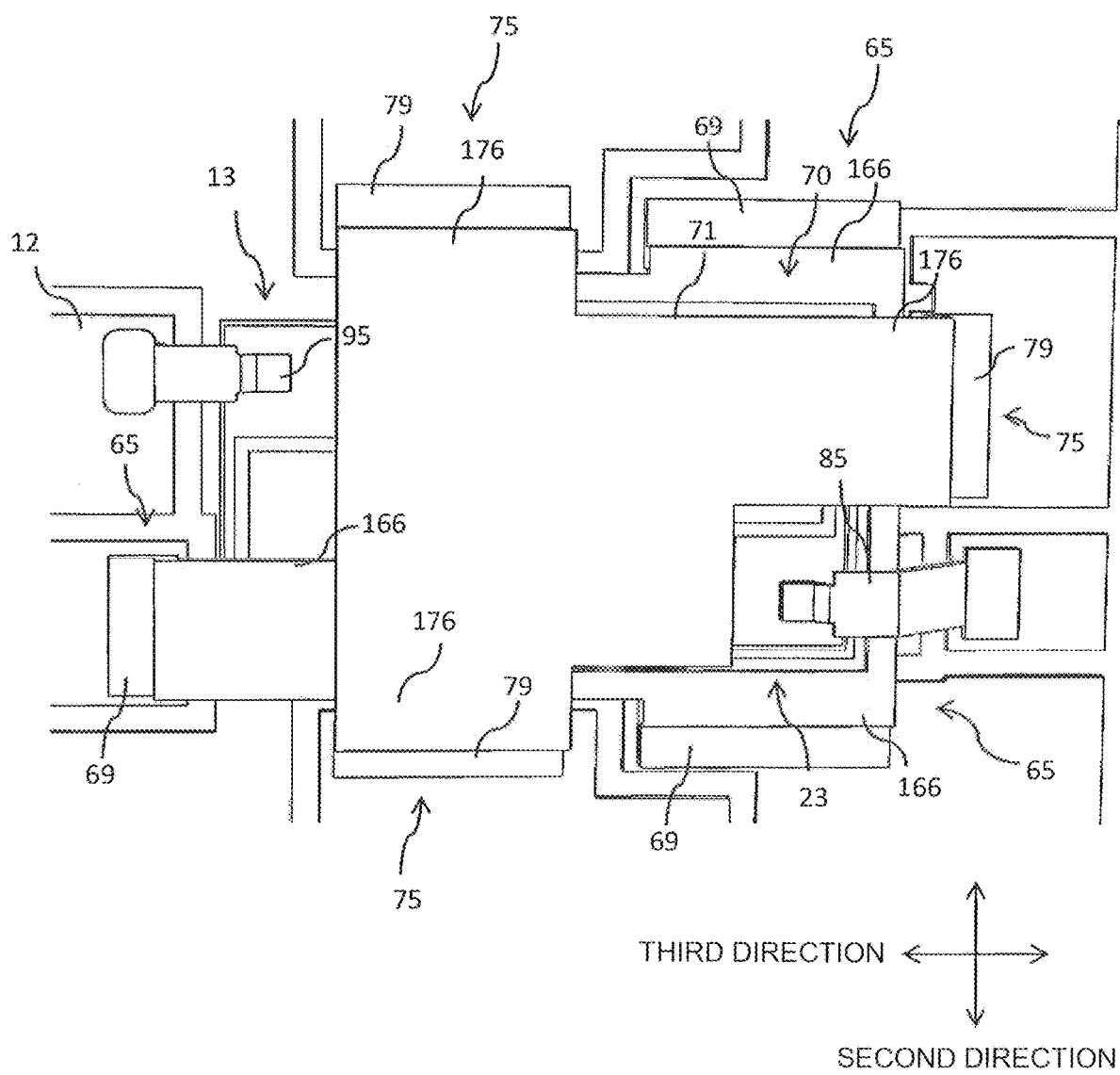
FIG. 12 is a plan view of the electronic module which can be used in the seventh embodiment of the present invention.
Figure 13:
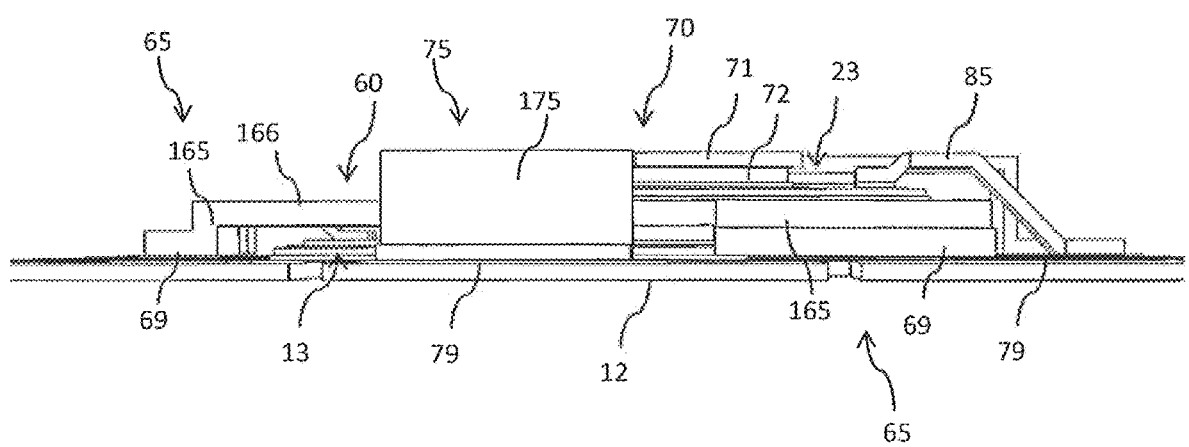
FIG. 13 is a side view of the electronic module which can be used in the seventh embodiment of the present invention.
Figure 13:

The fifth embodiment is the aspect in which the supporting parts 65 are provided, and the sixth embodiment is the aspect in which the extending parts 75 are provided. However, both of the supporting parts 65 and the extending parts 75 can be employed. In the present embodiment, as illustrated in FIGS. 11 to 13, an aspect will be described as an example in which three supporting parts 65 and three extending parts 75 are used. Regarding other components, any aspects described in the above embodiments can be employed. In the following description, the members described in the above embodiments are respectively denoted with the same reference numerals.

As indicated in the present embodiment, the extending part 75 may have a plane direction extending part 176 extending from a second head part 71 along a plane direction and a height direction extending part 175 extending from a plane direction extending part 176 along a height direction (first direction). Note that the plane direction extending part 176 means a part in which the size in the width direction is smaller than that of the second head part 71.

In a case where the supporting parts 65 and the extending parts 75 are employed as in the present embodiment and the manufacturing process described in the first embodiment is employed, the effects described in the fifth and sixth embodiments can be obtained. The present embodiment is advantageous in this point.

In terms of the manufacturing process, first, the first connector 60 can be more stably provided. In addition, the thickness of the conductive adhesive 5 disposed between the first electronic element 13 and the first connector 60 can be uniformed, and the reliability can be improved. In addition, when a chip module is manufactured, the first connector 60 can be more stably disposed, and manufacturing efficiency can be enhanced. Furthermore, the second connector 70 can be more stably provided. In addition, the thickness of the conductive adhesive 5 disposed between the second electronic element 23 and the second connector 70 can be uniformed, and the reliability can be improved. In addition, when a chip module is manufactured, the second connector 70 can be more stably disposed, and the manufacturing efficiency can be enhanced.

The descriptions of the embodiments and the disclosure of the drawings are merely examples for explaining the invention described in the claims, and the invention described in the claims is not limited by the descriptions of the embodiments or the disclosure of the drawings. Furthermore, the description in the claims at the time of the filing of the present application is merely an example, and the description in the claims can be appropriately changed based on the specification, the drawings, and the like.

REFERENCE SIGNS LIST

5 conductive adhesive
13 first electronic element
23 second electronic element
60 first connector
70 second connector
80 third connector
95 fourth connector
300 first plate supporting part (supporting part)
310 first conductive plate (conductive plate)
350 second plate supporting part (supporting part)
360 second conductive plate (conductive plate)
500 first jig
510 first jig recess
550 second jig
560 second jig recess

The invention claimed is:

1. A method of manufacturing a chip module used to manufacture an electronic module, the method comprising:
   disposing a first electronic element, to be placed on a conductive layer or a metal substrate, on a first jig;
   disposing a single first connector on the single first electronic element via a conductive adhesive in the first jig;

disposing a single second electronic element on the single first connector disposed on the first electronic element via a conductive adhesive in the first jig, and only the conductive adhesive is configured to exist between the single first connector and the single second electronic element;

disposing a second connector and a third connector, to be placed on a conductive layer or a metal substrate, on a second jig which is different from the first jig;

reversing the second jig in a state where the second connector is fixed to the second jig and disposing the single second connector on the single second electronic element via a conductive adhesive, wherein the second jig is configured to be reversed in a state where the second connector and the third connector are fixed to the second jig, and the second and the third connectors are disposed on the second electronic element via a conductive adhesive; and curing the conductive adhesives.

2. The method of manufacturing the chip module according to claim 1, wherein the first connector has a plurality of supporting parts, the second connector has a plurality of extending parts, the supporting parts is configured to contact with the first jig when disposing the first connector on the first electronic element via the conductive adhesive and the extending parts is configured to contact with the first jig when disposing the second connector on the second electronic element via the conductive adhesive.

3. The method of manufacturing the chip module, according to claim 1, further comprising disposing a third connector in the second jig, wherein the second jig is configured to be reversed in a state where the second connector and the third connector are fixed to the second jig, and the second connector and the third connector are disposed on the second electronic element via a conductive adhesive.

4. The method of manufacturing the chip module according to claim 1, wherein the second connector has an extending part, and the extending part is configured to contact with the first jig when disposing the second connector on the second electronic element via the conductive adhesive.

5. The method of manufacturing the chip module according to claim 1, wherein the first connector has a supporting part, and the supporting part is configured to contact with the first jig when disposing the first connector on the first electronic element via the conductive adhesive.

6. The method of manufacturing the chip module according to claim 1, wherein the first jig has a first jig recess corresponding to height of the chip module, or the second jig has a second jig recess corresponding to height of the chip module.

7. A method of manufacturing a chip module used to manufacture an electronic module, the method comprising:

disposing a first electronic element, to be placed on a conductive layer or a metal substrate, on a first jig;

disposing a second connector and a third connector, to be placed on a conductive layer or a metal substrate, on a second jig;

disposing a single second electronic element on the single second connector via a conductive adhesive in the second jig;

disposing a single first connector on the single second electronic element disposed on the second connector via a conductive adhesive in the second jig which is different from the first jig, and only the conductive adhesive is configured to exist between the single first connector and the single second electronic element;

reversing the first jig in a state where the first electronic element is fixed to the first jig and disposing the single first electronic element on the single first connector via a conductive adhesive, wherein the first jig is configured to be reversed in a state where the second connector and the third connector are fixed to the second jig, and the second and the third connectors are disposed on the second electronic element via a conductive adhesive; and curing the conductive adhesives.

* * * * *